(12) United States Patent
Wei et al.

(10) Patent No.: US 12,329,019 B2
(45) Date of Patent: Jun. 10, 2025

(54) DISPLAY SUBSTRATE, METHOD FOR MANUFACTURING THE DISPLAY SUBSTRATE AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Zhenye Wei, Beijing (CN); Qiyun Wang, Beijing (CN); Hongwei Zhang, Beijing (CN); Li Chen, Beijing (CN); Cheng Zeng, Beijing (CN); Xiongyi Luo, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/796,552

(22) PCT Filed: Aug. 31, 2021

(86) PCT No.: PCT/CN2021/115746
§ 371 (c)(1),
(2) Date: Jul. 29, 2022

(87) PCT Pub. No.: WO2023/028854
PCT Pub. Date: Mar. 9, 2023

(65) Prior Publication Data
US 2024/0188396 A1  Jun. 6, 2024

(51) Int. Cl.
*H10K 59/80* (2023.01)
*H10K 59/35* (2023.01)

(52) U.S. Cl.
CPC ........... *H10K 59/879* (2023.02); *H10K 59/35* (2023.02)

(58) Field of Classification Search
None
See application file for complete search history.

(56) References Cited

U.S. PATENT DOCUMENTS

| | | | |
|---|---|---|---|
| 2013/0187840 A1* | 7/2013 | Tomita | H10K 59/38 345/76 |
| 2016/0276418 A1* | 9/2016 | Xu | H10K 50/856 |
| 2017/0031205 A1* | 2/2017 | Lee | G02F 1/133514 |
| 2021/0408128 A1* | 12/2021 | Peng | H10K 59/8792 |

* cited by examiner

*Primary Examiner* — Asok K Sarkar
(74) *Attorney, Agent, or Firm* — HOUTTEMAN LAW LLC (57) ABSTRACT

Provided are a display substrate, a manufacturing method thereof, a display device. The display substrate includes sub-pixel units on a base layer, each sub-pixel unit includes a light propagation unit including a first medium structure and a second medium structure, orthographic projections of the first medium structure and the light emitting unit on the base layer are at least partially overlapped, the second medium structure contacts at least one side of the first medium structure. The first medium structure has a refractive index larger than that of the second medium structure. A first included angle between a diagonal line and a bottom side of a first cross section of the first medium structure is equal to a total reflection angle at a contact surface between the first medium structure and the second medium structure. The first included angle is smaller than or equal to a preset angle.

20 Claims, 5 Drawing Sheets

006
DISPLAY SUBSTRATE, METHOD FOR MANUFACTURING THE DISPLAY SUBSTRATE AND DISPLAY DEVICE

TECHNICAL FIELD

The present disclosure relates to the field of display technology, and in particular to a display substrate, a method for manufacturing a display substrate and a display device.

BACKGROUND

Quantum dot organic light-emitting diodes (QD-OLEDs) are considered as a next generation display scheme because they have excellent color gamut and good color exhibition capability; and they use blue OLEDs as backlight sources to excite photochromic quantum dot (QD) particles, thereby obtaining red light and green light.

SUMMARY

Embodiments of the present disclosure provide a display substrate, a method for manufacturing a display substrate, and a display device.

According to a first aspect of the present disclosure, a display substrate is provided, the display substrate includes a base layer and a plurality of sub-pixel units which are arranged in an array on a side of the base layer, the sub-pixel units corresponding to light emitting units one by one, and at least part of the sub-pixel units form one pixel unit, wherein the sub-pixel unit further includes a light propagation unit located on a side of a light emitting surface of the light emitting unit: the light propagation unit includes a first medium structure and a second medium structure, an orthographic projection of the first medium structure on the base layer at least partially overlaps with an orthographic projection of one of the light emitting units, corresponding to the first medium structure, on the base layer, and the second medium structure is arranged in contact with at least one side of the first medium structure in a direction parallel to a plane where the base layer is located: the first medium structure has a first refractive index, the second medium structure has a second refractive index, and the first refractive index is greater than the second refractive index: a first included angle between a diagonal line and a bottom side of a first cross section of the first medium structure is equal to a total reflection angle at a contact surface between the first medium structure and the second medium structure, and the first cross section is a cross section of the first medium structure along a direction perpendicular to the contact surface and a direction perpendicular to the light emitting surface of the light emitting unit: the first included angle is smaller than or equal to a preset angle, so that in the light incident from a bottom surface of the first medium structure facing the light emitting unit at any angle, a proportion, larger than or equal to a preset proportion, of light is emitted from a top surface of the first medium structure facing away from the light emitting unit, where the preset angle is about 60°.

In some implementations, the first included angle ranges from about 10° to about 40°.

In some implementations, a height and a width of the first cross section of the first medium structure satisfy the following relationship:

$$a = \frac{L \times \tan\theta_1 \times \tan\theta_2}{\tan\theta_1 + \tan\theta_2},$$

where a is the height of the first cross section of the first medium structure, L is the width of the first cross section of the first medium structure, $\theta_1$ is the first included angle, and $\theta_2$ is a second included angle between the contact surface between the second medium structure and the first medium structure and a bottom surface of the second medium structure facing the light emitting unit.

In some implementations, the second included angle ranges from about 10° to about 90°.

In some implementations, the second included angle ranges from about 50° to about 90°.

In some implementations, the height of the first cross-section ranges from about 2 μm to about 20 μm.

In some implementations, the sub-pixel unit further includes a light conversion unit located at a side of the first medium structure away from the light emitting unit: an orthographic projection of the light conversion unit on the base layer is at least partially overlapped with an orthographic projection of the light emitting unit on the base layer: the orthographic projection of the light conversion unit on the base layer at least partially overlaps with the orthographic projection of the first medium structure on the base layer: the light conversion unit is configured to convert a color of light emitted by the light emitting unit into a target color.

In some implementations, the light conversion unit includes a quantum dot structure.

In some implementations, a ratio of the second refractive index to the first refractive index ranges from about 0.5 to about 0.9.

In some implementations, an orthographic projection of the first medium structure on a plane where the light emitting surface of the light emitting unit is located covers an orthographic projection of the light emitting unit on the plane where the light emitting surface of the light emitting unit is located.

In some implementations, the first cross section of the first medium structure is in a shape of rectangle, and a cross section of the second medium structure in a direction perpendicular to the contact surface and a direction perpendicular to the light emitting surface of the light emitting unit is in a shape of rectangle: or the first cross section of the first medium structure is in a shape of inverted trapezoid, and the cross section of the second medium structure in the direction perpendicular to the contact surface and the direction perpendicular to the light emitting surface of the light emitting unit is in a shape of trapezoid.

In some implementations, the second medium structure is disposed between two adjacent first medium structures, and colors of light emitted from the sub-pixel units corresponding to the two adjacent first medium structures are different.

In some implementations, the orthographic projection of the light conversion unit on the base layer covers the orthographic projection of the light emitting unit, corresponding to the light conversion unit, on the base layer.

In some implementations, a material of the second medium structure is a siloxane material doped with hollow particles.

In some implementations, the plurality of sub-pixel units include a red sub-pixel unit, a green sub-pixel unit and a blue sub-pixel unit, and the light emitting units corresponding to the plurality of sub-pixel units emit blue light.

In some implementations, each pixel unit includes three sub-pixel units including a first sub-pixel unit, a second sub-pixel unit, and a third sub-pixel unit: colors of light emitted by the light emitting units corresponding to the sub-pixel units are all a first color: the first sub-pixel unit includes a first light conversion unit, the second sub-pixel unit includes a second light conversion unit, and the third sub-pixel unit includes a light-transmitting unit: the first light conversion unit is configured to convert the first color of light emitted by the light emitting unit corresponding thereto into a second color: the second light conversion unit is configured to convert the first color of light emitted by the light emitting unit corresponding thereto into a third color: the light-transmitting unit is configured to transmit the light emitted by the light emitting unit corresponding thereto without changing the first color.

In some implementations, the first color is blue, the second color is red, and the third color is green.

According to a second aspect of the present disclosure, there is provided a display device including the above display substrate.

According to a third aspect of the present disclosure, there is provided a method for manufacturing a display substrate, the method includes: providing a base layer: forming a plurality of light emitting units arranged in an array on a side of the base layer, the light emitting units corresponding to sub-pixel units one by one, and at least part of the plurality of sub-pixel units form one pixel unit: forming a light propagation unit on a side of each light emitting unit away from the base layer, where the light propagation unit includes a first medium structure and a second medium structure, an orthographic projection of the first medium structure on the base layer at least partially overlaps with an orthographic projection of one of the light emitting units, corresponding to the first medium structure, on the base layer, and the second medium structure is arranged in contact with at least one side of the first medium structure in a direction parallel to a plane where the base layer is located: the first medium structure has a first refractive index, the second medium structure has a second refractive index, and the first refractive index is greater than the second refractive index: a first included angle between a diagonal line and a bottom side of a first cross section of the first medium structure is equal to a total reflection angle at a contact surface between the first medium structure and the second medium structure, and the first cross section is a cross section of the first medium structure along a direction perpendicular to the contact surface and a direction perpendicular to the light emitting surface of the light emitting unit: the first included angle is smaller than or equal to a preset angle, so that in the light incident from a bottom surface of the first medium structure facing the light emitting unit at any angle, a proportion, larger than or equal to a preset proportion, of light is emitted from a top surface of the first medium structure facing away from the light emitting unit, where the preset angle is about 60°.

DRAWINGS

The accompanying drawings are intended to provide a further understanding of the present disclosure, constitute a part of the description, and are used to explain the present disclosure together with the following specific embodiments, but do not constitute a limitation of the present disclosure. In the drawings.

DETAILED DESCRIPTION

In order to make those skilled in the art better understand the technical solutions of the embodiments of the present disclosure, technical solutions of a display substrate, a method for manufacturing a display substrate, and a display device provided in the embodiments of the present disclosure will be clearly and completely described below with reference to the drawings of the embodiments of the present disclosure.

Example embodiments will be described more fully hereinafter with reference to the accompanying drawings, but the example embodiments may be embodied in different forms and should not be construed as limited to the embodiments set forth herein. Rather, these embodiments are provided so that the present disclosure will be thorough and complete, and will fully convey the scope of the present disclosure to those skilled in the art.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprise" and/or "include" when used in the specification, specify the presence of features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements/structures, these elements/structures should not be limited by these terms. These terms are only used to distinguish one element/structure from another element/structure.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the related art, in the QD-OLED device, since the OLED is a surface light source, if the emitted light cannot be collected and emitted in a collimated manner, the effect of the QD particles effectively utilizing the light from the OLED may be affected.

Figure 1A:
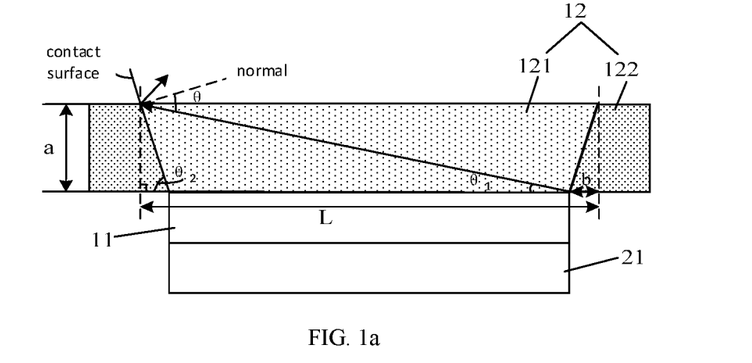
FIG. 1a is a schematic structural diagram of a sub-pixel unit according to an embodiment of the present disclosure.
Figure 1B:
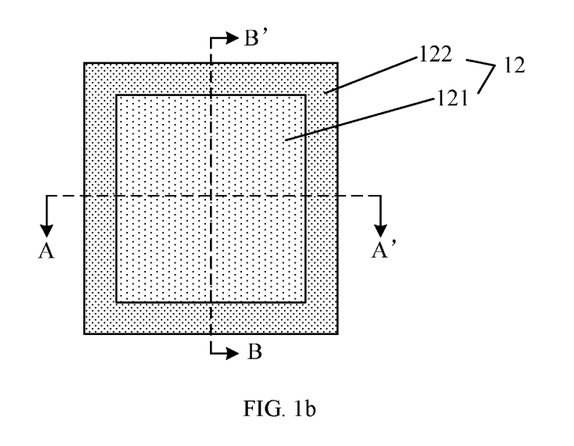
FIG. 1b is a schematic plan view of a sub-pixel unit according to an embodiment of the present disclosure.

In view of this, an embodiment of the present disclosure provides a sub-pixel unit, where FIG. 1a is a schematic structural diagram of the sub-pixel unit provided by the embodiment of the present disclosure, and FIG. 1b is a schematic plan view of the sub-pixel unit provided by the embodiment of the present disclosure, as shown in FIG. 1a and FIG. 1b, the sub-pixel unit includes: a base layer 21, a light emitting unit 11 located on a side of the base layer 21, and a light propagation unit 12 located on a side of a light emitting surface of the light emitting unit 11, where the light propagation unit 12 includes a first medium structure 121 and a second medium structure 122, an orthographic projection of the first medium structure 121 on the base layer 21 is at least partially overlapped with an orthographic projection of the light emitting unit 11 on the base layer 21, and the second medium structure 122 is arranged in contact with at least one side of the first medium structure 121 in a direction parallel to a plane where the base layer 21 is located: the first medium structure 121 has a first refractive index n1 and the second medium structure 122 has a second refractive index n2, the first refractive index n1 being greater than the second refractive index n2.

In some implementations, as shown in FIG. 1b, the second medium structure 122 is disposed around all periphery sides of the first medium structure 121, and a side of the second medium structure 122 facing the first medium structure 121 is in direct contact with the all periphery sides of the first medium structure 121, the periphery sides of the first medium structure 121 being referred to as the contact surface between the first medium structure 121 and the second medium structure 122 in the embodiment of the present disclosure. Alternatively, the second medium structure 122 may be disposed in contact with the first medium structure 121 on only one or more periphery sides of the first medium structure 121. For example, a visual effect caused by color crosstalk between sub-pixels of different colors is relatively strong, while the color crosstalk between sub-pixels of a same color is relatively imperceptible, and thus, for reducing process complexity, the second medium structure 122 may be only disposed between first medium structures 121 corresponding to any two adjacent sub-pixels of different colors. For example, a material the same as that of the first medium structure 121 may be filled between first medium structures 121 corresponding to any two adjacent sub-pixels of the same color (or the material filled between the first medium structures 121 and the first medium structures 121 may be manufactured by a single process).

In the embodiment of the present disclosure, the first medium structure 121 is an optically dense medium, and the second medium structure 122 is an optically sparse medium. According to the total internal reflection (TIR) principle, when light enters a medium with a lower refractive index (also called an optically sparse medium) from a medium with a higher refractive index (also called an optically dense medium), when an incident angle of the light is greater than or equal to a total reflection angle (also called a critical angle) θc, that is, the incident light is far away from a normal, refracted light will disappear, and all the incident light will be reflected without entering the medium with the lower refractive index: when the incident angle is smaller than the total reflection angle θc, the light is refracted into the medium with the lower refractive index and is reflected to the medium with the higher refractive index at the same time.

According to the definition of total reflection, a condition under which the total reflection occurs at the contact surface (interface) between the first medium structure 121 and the second medium structure 122 is: $\theta \geq \arcsin(n2/n1)$, where θ is an included angle between the incident light and a normal of the contact surface, n2 is a second refractive index of the second medium structure 122, n1 is a first refractive index of the first medium structure 121, and $\arcsin(n2/n1)$ refers to the total reflection angle at the contact surface.

Therefore, light emitted from the light emitting unit 11 enters the first medium structure 121 through a bottom surface of the first medium structure 121 facing the light emitting unit 11, and when the light entering from the bottom surface of the first medium structure 121 irradiates onto the contact surface between the first medium structure 121 and the second medium structure 122 and the incident angle of the light is greater than or equal to the total reflection angle of $\arcsin(n2/n1)$ at the contact surface between the first medium structure 121 and the second medium structure 122, the light will be totally reflected at the contact surface between the first medium structure 121 and the second medium structure 122.

For all the light incident from the bottom surface of the first medium structure 121 facing the light emitting unit 11, any light irradiated onto the contact surface at an incident angle greater than or equal to the total reflection angle will be totally reflected, so that the collection effect of the light emitted from the light emitting unit 11 is effectively improved, and the utilization rate of light emitted by the light emitting unit 11 is improved.

In the embodiment of the present disclosure, in practical applications, the light emitting unit 11 may be an organic light emitting diode (OLED), for example, a blue organic light emitting diode, and by providing the light propagation unit 12, the collection effect of the light emitted by the light emitting unit 11 is effectively improved, so that the light emitting efficiency of the light emitting unit 11 is effectively improved. In practical applications, the sub-pixel unit may be applied to QD-OLED devices, which can effectively improve the effect that QD particles utilizes the light emitted from the light emitting unit 11.

FIG. 1a is a schematic diagram of a longitudinal cross section of the sub-pixel unit shown in FIG. 1b taken along an AA' direction or a BB' direction.

In the embodiment of the present disclosure, as shown in FIGS. 1a and 1b, a first included angle θ1 between a diagonal line and a bottom side of a first cross section of the first medium structure 121 is equal to the total reflection angle at the contact surface between the first medium structure 121 and the second medium structure 122, that is, the first included angle θ1 is equal to $\arcsin(n2/n1)$, and the first cross section is a longitudinal cross section of the first medium structure 121 along a direction perpendicular to the contact surface and a direction perpendicular to the light emitting surface of the light emitting unit 11 (i.e., the AA' direction or the BB' direction). With such an arrangement, when light irradiates onto the contact surface between the first medium structure 121 and the second medium structure 122 at an incident angle greater than or equal to the first included angle θ1, total reflection occurs, so that the incident angle of light incident on a top of the contact surface from the bottom surface of the first medium structure 121 may be greater than or equal to the first included angle θ1 and total reflection occurs, on one hand, the collection effect of light emitted by the light emitting unit 11 is further improved, and the light emitting efficiency of the light emitting unit 11 is improved, on the other hand, in practical applications, light crosstalk between adjacent sub-pixels can be effectively avoided, and the effect that the QD particles utilizes the light emitted from the light emitting unit 11 may be further improved.

It should be noted that, in the embodiment of the present disclosure, when the contact surface between the first medium structure 121 and the second medium structure 122 is in a shape of arc, the direction perpendicular to the contact surface may be understood as a direction perpendicular to a tangent plane of the contact surface.

Since the first included angle $\theta_1$ is equal to the total reflection angle at the contact surface between the first medium structure 121 and the second medium structure 122, the smaller the first included angle $\theta_1$ is, the more the light that can be totally reflected by the contact surface is, that is, more light can be totally reflected, the better the collection effect of the light emitted by the light emitting unit 11 in the first medium structure 121 is, the higher the light emitting efficiency of the light emitting unit 11 is, in practical applications, the higher the intensity of light emitted from the OLED that can be effectively utilized is, and the better the effect that the QD particles utilizes the light emitted by the OLED is. Therefore, by adjusting the first included angle $\theta_1$, the proportion of light, which can be effectively utilized, in the light emitted by the light emitting unit 11 and incident from the bottom surface of the first medium structure 121 facing the light emitting unit 11 can be adjusted.

In the embodiment of the present disclosure, as shown in FIG. 1a, the first included angle $\theta_1$ may be set to be smaller than or equal to a preset angle, so that, in the light incident from the bottom surface of the first medium structure 121 facing the light emitting unit 11 at any angle, a proportion, which is larger than or equal to a preset proportion, of light can be emitted from a top surface of the first medium structure 121 away from the light emitting unit 11, that is, the proportion, which is larger than or equal to the preset proportion, of light can be effectively utilized.

In some implementations, the preset angle may be set to about 60°, and the first included angle $\theta_1$ may be less than or equal to about 60°, for example, the first included angle $\theta_1$ may be in a range from about 10° to about 60°. When the first included angle $\theta_1$ is less than or equal to about 60°, light can be effectively utilized with less influence of color crosstalk on adjacent pixels.

In some implementations, a ratio of the second refractive index n2 to the first refractive index n1 is in a range from about 0.5 to about 0.9, which can ensure that the proportion, which is greater than or equal to the preset proportion, of light can be effectively utilized.

In some implementations, the first included angle $\theta_1$ may range from about 10° to about 40°, for example, the first included angle $\theta_1$ may be set to about 40°. When the first included angle $\theta_1$ is in the range from about 10° to about 40°, the proportion of light that can be effectively utilized is relatively large.

In some implementations, an orthographic projection of the first medium structure 121 on the base layer 21 coincides with an orthographic projection of the light emitting unit 11 on the base layer 21, or the orthographic projection of the first medium structure 121 on the base layer 21 covers the orthographic projection of the light emitting unit 11 on the base layer 21. With such structure design, the light emitted by the light emitting unit 11 can be fully utilized, and the light emitting efficiency of the display substrate is improved.

It should be noted that, in the case where the orthographic projection of the first medium structure 121 on the base layer 21 covers the orthographic projection of the light emitting unit 11 on the base layer 21, the first included angle $\theta_1$ between the diagonal line and the bottom side of the first cross section of the first medium structure 121 may still be less than or equal to about 60°. It should be understood that, in the case where the orthographic projection of the first medium structure 121 on the base layer 21 covers the orthographic projection of the light emitting unit 11 on the base layer 21, compared to a case where the orthographic projection of the first medium structure 121 on the base layer 21 coincides with the orthographic projection of the light emitting unit 11 on the base layer 21 or the orthographic projection of the light emitting unit 11 on the base layer 21 covers the orthographic projection of the first medium structure 121 on the base layer 21, in the light emitted from a vertex of the first included angle $\theta_1$, a proportion of light that are not totally reflected at the contact surface between the first medium structure 121 and the second medium structure 122 on a side opposite to the vertex of the first included angle $\theta_1$ is lower, and thus, a better effect of preventing color crosstalk can be achieved.

In some implementations, an encapsulation structure may be further provided between the light emitting unit 11 and the first medium structure 121, for example, the light emitting unit 11 is encapsulated by three encapsulation sublayers including an inorganic layer, an organic layer, and an inorganic layer, so as to protect the light emitting unit 11 from being eroded by water and oxygen.

In some implementations, as shown in FIG. 1a, a height a and a width L of the first cross section of the first medium structure 121 satisfy the following relationship:

$$a = \frac{L \times \tan \theta_1 \times \tan \theta_2}{\tan \theta_1 + \tan \theta_2},$$

where a is the height of the first cross section of the first medium structure 121, L is the width of the first cross section of the first medium structure 121, $\theta_1$ is the first included angle, and $\theta_2$ is a second included angle between the contact surface between the second medium structure 122 and the first medium structure 121 and the bottom surface of the first medium structure 121 facing the light emitting unit 11.

The second included angle $\theta_2$ is in a range from about 10° to about 90°. In some implementations, the second included angle $\theta_2$ ranges from about 50° to about 90°. In some implementations, the second included angle $\theta_2$ is about 90°. In some implementations, the second included angle $\theta_2$ is less than about 90°.

In some implementations, the first cross section of the first medium structure 121 has a shape of an inverted trapezoid, and the longitudinal cross section of the second medium structure 122 along a direction perpendicular to the contact surface and a direction perpendicular to the light emitting surface of the light emitting unit 11 (i.e., the AA' direction or the BB' direction) has a shape of a trapezoid. The inverted trapezoid is a shape that an upper width thereof is greater than a lower width thereof.

Figure 2:
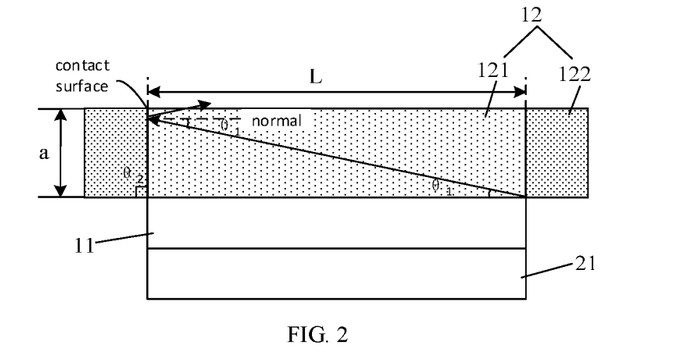
FIG. 2 is a schematic structural diagram of another sub-pixel unit according to an embodiment of the present disclosure.

It should be noted that FIG. 1a only illustrates a case where the first cross section of the first medium structure 121 is in the shape of the inverted trapezoid, and the longitudinal cross section of the second medium structure 122 is in the shape of the trapezoid, but the embodiment of the present disclosure is not limited thereto. FIG. 2 is a schematic structural diagram of another sub-pixel unit provided in the embodiment of the present disclosure, and in some implementations, as shown in FIG. 2, the first cross section of the first medium structure 121 is in a shape of rectangle, and the longitudinal cross section of the second medium structure 122 along the direction perpendicular to the contact surface and the direction perpendicular to the light emitting surface of the light emitting unit 11 (i.e., the AA' direction or the BB' direction) is in a shape of rectangle.

In some implementations, the height a of the first cross section ranges from about 2 μm to about 20 μm.

In some implementations, the sub-pixel unit is applied to a display substrate, the display substrate includes a plurality of sub-pixel units arranged in an array, and a width of the first cross section of the first medium structure 121 in each sub-pixel unit is equal to a pixel width corresponding to a pixel resolution of the display substrate.

A relationship between the height a and the width L of the first cross section of the first medium structure 121, the first included angle $\theta_1$, and the second included angle $\theta_2$ will be described in detail below by taking the sub-pixel unit shown in FIG. 1a and the sub-pixel unit shown in FIG. 2 as examples.

In a case where the first cross section of the first medium structure 121 is in the shape of rectangle, and the longitudinal cross section of the second medium structure 122 is in the shape of rectangle, as shown in FIG. 2, light enters the first medium structure 121 at an angle θ between the light and the bottom surface of the first medium structure 121, and is incident onto the contact surface between the first medium structure 121 and the second medium structure 122, in such case, an angle between the light and a normal of the contact surface is θ. When the light is incident along the diagonal of the first cross section of the first medium structure 121, the included angle θ is the first included angle $\theta_1$, and a relationship between the height a and the width L of the first cross section of the first medium structure 121, the first included angle $\theta_1$, and the second included angle $\theta_2$ satisfies: tan $\theta_1$=a/L.

Figure 3:
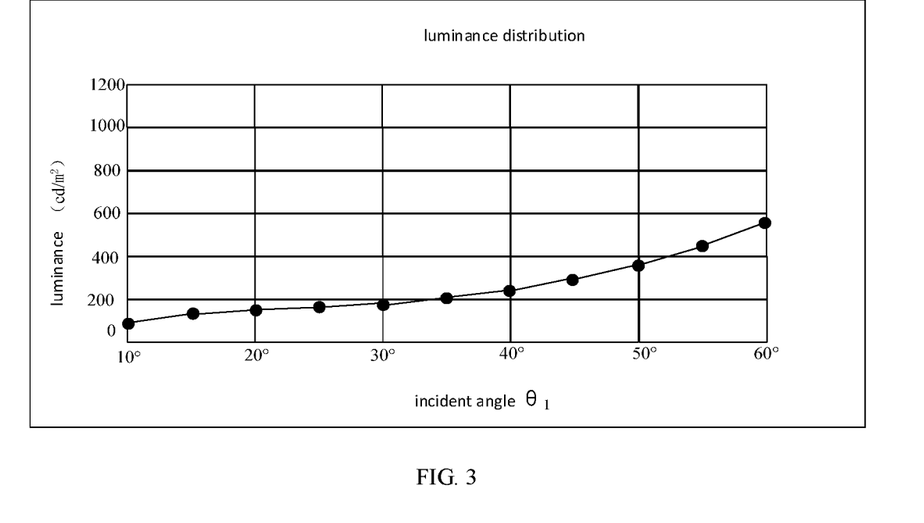
FIG. 3 is a graph showing a luminance distribution of light with a first included angle $\theta 1$ in a range from about 10° to about 60° in an embodiment of the present disclosure.

FIG. 3 is a graph showing a luminance distribution of light with the first included angle $\theta_1$ in the range from about 10° to about 60°, and a relationship between the first included angle $\theta_1$ and the luminance of light may be determined according to experimental test data of the liminance of light emitted from the light emitting unit 11 (such as a blue OLED) at different first included angles $\theta_1$, where the luminance distribution curve of light with the first included angle $\theta_1$ within the range from about 10° to about 60° is shown in FIG. 3.

According to the relationship between the first included angle $\theta_1$ and the luminance of light, when the first included angle is $\theta_1$, an integral is performed on the luminance distribution curve corresponding to a range from $\theta_1$ to about 60°, and recorded as a first integral, and an integral is performed on the luminance distribution curve corresponding to a range from about 10° to about 60°, and recorded as a second integral, and the proportion of light, which can be effectively utilized, with the first included angle $\theta_1$ being at different angles may be determined according to a ratio of the first integral to the second integral.

TABLE 1

| $\theta_1$ | proportion of light |
|---|---|
| 10° | 100% |
| 15° | 99% |
| 20° | 98% |
| 25° | 96% |
| 30° | 94% |
| 35° | 92% |
| 40° | 90% |
| 45° | 87% |
| 50° | 83% |
| 55° | 79% |
| 60° | 74% |

Figure 4:
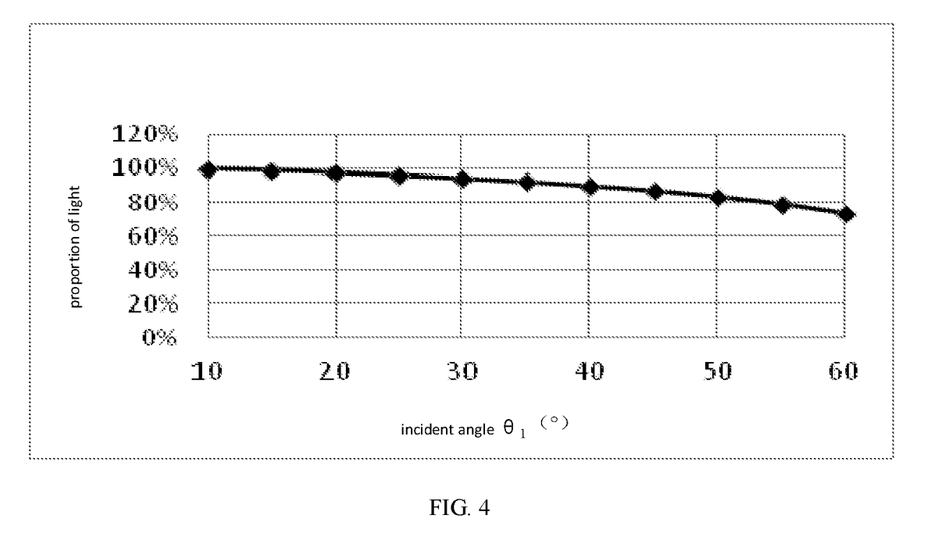
FIG. 4 is a schematic diagram of a proportion of light, that can be effectively utilized, with the first included angle $\theta 1$ being at different angles.

FIG. 4 is a schematic diagram illustrating proportions of light that can be effectively utilized under different angles of the first included angle θ1, where table 1 shows results of the proportions of the light that can be effectively utilized under different angles of the first included angle θ1, which are obtained by theoretical tests, and as shown in table 1 and FIG. 4, when the first included angle $\theta_1$ is about 10°, the light incident at an incident angle (an included angle between the incident light and the bottom surface of the first medium structure 121) that is greater than or equal to about 10° is totally reflected at the contact surface between the first medium structure 121 and the second medium structure 122, that is, substantially all the light at the incident angles is totally reflected at the contact surface, and according to the ratio between the integrals, it is determined that the proportion of the light that can be effectively utilized is as high as about 100%. When the first included angle $\theta_1$ is about 40°, all the light incident at an incident angle (an included angle between the incident light and the bottom surface of the first medium structure 121) greater than or equal to about 40° is totally reflected at the contact surface between the first medium structure 121 and the second medium structure 122, that is, substantially most of the light at the incident angles is totally reflected at the contact surface, and according to the ratio between the integrals, it is determined that the proportion of the light that can be effectively utilized is as high as about 90%.

As can be seen from the above table, the smaller the value of the first included angle $\theta_1$ is, the higher the intensity of the light, emitted from the light emitting unit 11, that can be effectively utilized is, generally, if 90% of the light is utilized, the crosstalk of light to adjacent sub-pixels may be ignored, as can be seen from the above table, in such case, the first included angle $\theta_1$=40°, that is, the total reflection angle is 40°, when the first included angle $\theta_1$ is in a range from about 10° to about 40°, the effect that the light is utilized is better, and the utilization rate of the light may be as high as about 90% or more.

For example, when the preset angle is about 60°, the preset proportion of light may be the proportion of light, i.e., 74%, corresponding to the first included angle $\theta_1$ being about 60° in the table 1.

In practical applications, the width of the first cross section of the first medium structure 121 in the sub-pixel unit may be defined as the pixel width corresponding to the pixel resolution of the display substrate, and when the pixel resolution is about 600 PPI, the pixel width should be about 42 μm, and when the first included angle $\theta_1$=40°, according to the above formula tan $\theta_1$=a/L, where L is the pixel width, i.e., the width of the first cross section of the first medium structure 121, heights (thicknesses) of the first medium structure 121 and the second medium structure 122 should be a=L×tan θ₁, i.e., a=34 μm. When the pixel resolution is about 300 PPI, the pixel width should be about 84 μm, and when the first included angle $\theta_1=40°$, according to the above formula tan $\theta_1$=a/L, where L is the pixel width, the heights (thicknesses) of the first medium structure 121 and the second medium structure 122 should be a=L×tan $\theta_1$, i.e., a=70 μm. When the pixel resolution is about 160 PPI, the pixel width should be about 159 μm, and when the first included angle $\theta_1=40°$, according to the above formula tan $\theta_1$=a/L, where L is the pixel width, the heights (thicknesses) of the first medium structure 121 and the second medium structure 122 should be a=L×tan $\theta_1$, i.e., a=131 μm.

In the sub-pixel unit shown in FIG. 2, the amount of light that can be utilized depends mainly on the ratio of the refractive index of the second medium structure 122 to the refractive index of the first medium structure 121, i.e., depends on a value of the first included angle $\theta_1$.

Figure 5:
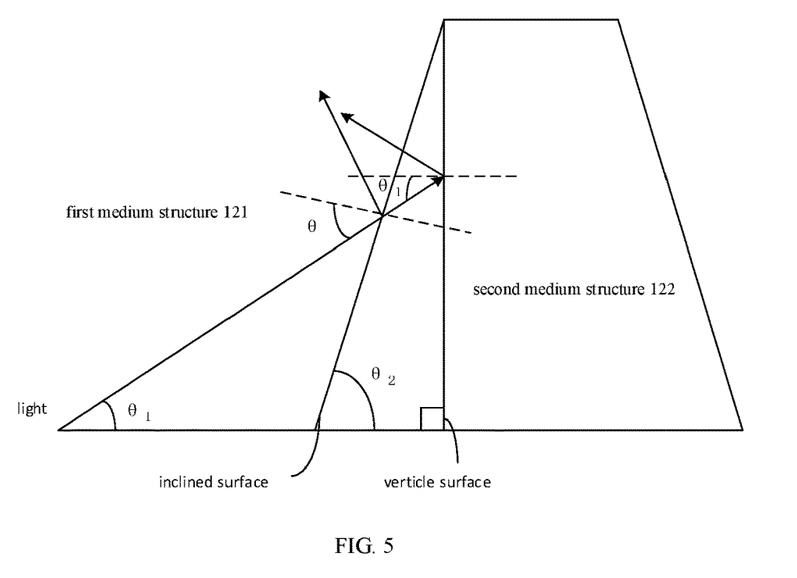
FIG. 5 is a schematic diagram of light incident from a bottom surface of a first medium structure to a contact surface between the first medium structure and a second medium structure.

To further improve the effect that the light is utilized (i.e., the utilization effect of the light), in some implementations, the first cross section of the first medium structure 121 is in the shape of inverted trapezoid, and the longitudinal cross section of the second medium structure 122 is in the shape of trapezoid. FIG. 5 is a schematic diagram of light incident from the bottom surface of the first medium structure to the contact surface between the first medium structure and the second medium structure, where the contact surface between the first medium structure 121 and the second medium structure 122 is a vertical surface (perpendicular to the bottom surface) in a case where the first cross section is in the shape of rectangle, the contact surface between the first medium structure 121 and the second medium structure 122 is an inclined surface (inclined with respect to a normal of the bottom surface) in a case where the first cross section of the first medium structure 121 is in the shape of inverted trapezoid, and the longitudinal cross section of the second medium structure 122 is in the shape of trapezoid, and as shown in FIGS. 1a and 5, assuming that an incident angle of the incident light is $\theta_1$, i.e., the light is incident at an incident angle of $\theta_1$, a reflection angle of the light (i.e., a reflection angle at which the light is reflected) at the vertical surface, i.e., the first included angle, should be $\theta_1$, a reflection angle of the light at the inclined surface is θ, and an angle between the inclined surface and the bottom surface, i.e., a second included angle, is $\theta_2$, it can be known from a geometrical relationship that, in a case where the incident angle of the incident light remains as $\theta_1$, the reflection angle θ of the light at the inclined surface meets the equation: θ–$\theta_1$+90°–$\theta_2$. When the contact surface is the vertical surface, the reflection angle θ of the light at the vertical surface is $\theta_1$, and when the contact surface is the inclined surface, the reflection angle θ of the light at the inclined surface is changed and is increased by 90°–$\theta_2$ from the previous $\theta_1$.

TABLE 2

| θ₁ | proportion of light | angle (°) | θ₂ 10 | 20 | 30 | 40 | 50 | 60 | 70 | 80 | 90 |
|---|---|---|---|---|---|---|---|---|---|---|---|
| | 100% | 10 | 90 | 80 | 70 | 60 | 50 | 40 | 30 | 20 | 10 |
| | 98% | 20 | — | 90 | 80 | 70 | 60 | 50 | 40 | 30 | 20 |
| | 94% | 30 | — | — | 90 | 80 | 70 | 60 | 50 | 40 | 30 |
| | 90% | 40 | — | — | — | 90 | 80 | 70 | 60 | 50 | 40 |
| | 83% | 50 | — | — | — | — | 90 | 80 | 70 | 60 | 50 |
| | 74% | 60 | — | — | — | — | — | 90 | 80 | 70 | 60 |
| | 58% | 70 | — | — | — | — | — | — | 90 | 80 | 70 |
| | 37% | 80 | — | — | — | — | — | — | — | 90 | 80 |
| | 13% | 90 | — | — | — | — | — | — | — | — | 90 |

Table 2 shows results of the proportions of the light that can be effectively utilized under different values of the first included angle $\theta_1$ and the second included angle $\theta_2$, which are obtained by theoretical tests, and the table 2 shows a relationship between the reflection angle θ at the inclined surface, the first included angle $\theta_1$, and the second included angle $\theta_2$, and the proportions of the light that can be effectively utilized under different values of the first included angle $\theta_1$ and the second included angle $\theta_2$, as shown in table 2, when the incident angle of the light, i.e., the first included angle $\theta_1$, is about 10°, an optimal utilization rate of light is achieved, and when the second included angle $\theta_2=50°$, the reflection angle θ of the light at the inclined contact surface is 50°. When the incident angle of the light, i.e., the first included angle $\theta_1$, is about 40°, the utilization rate of light of about 90% is achieved, and when the second included angle $\theta_2$–50°, the reflection angle θ of the light at the inclined contact surface is 80°.

According to table 2, when the first included angle θ 1 is in a range from about 10° to about 40°, and the second included angle $\theta_2$ is in a range from about 50° to about 90°, the utilization effect of light (i.e., the effect that the light is utilized) is optimal, and the utilization rate of light is as high as 90% or more.

For example, when the preset angle is about 60°, the preset proportion of light may be a proportion of light, i.e., 74%, corresponding to the first included angle $\theta_1$ being about 60° in table 1.

As can be seen from the geometrical relationship in FIG. 1a, heights (thicknesses) of the first medium structure 121 and the second medium structure 122 are $$a = \frac{L \times \tan\theta_1 \times \tan\theta_2}{\tan\theta_1 + \tan\theta_2}, \text{ and } b = \frac{a}{\tan\theta_2}.$$

In practical applications, the width of the first cross section of the first medium structure 121 in the sub-pixel unit is equal to the pixel width corresponding to the pixel resolution of the display substrate, when the pixel resolution is about 600 PPI, the pixel width should be about 42 μm, and when the first included angle $\theta_1=40°$ and the second included angle $\theta_2=70°$, the heights (thicknesses) of the first medium structure 121 and the second medium structure 122 should be a=27 μm, according to the above formula $$a = \frac{L \times \tan\theta_1 \times \tan\theta_2}{\tan\theta_1 + \tan\theta_2},$$

where L is the pixel width, that is, the width of the first cross section. When the pixel resolution is about 300 PPI, the pixel width should be about 84 μm, and when the first included angle $\theta_1=40°$ and the second included angle $\theta_2=70°$, the heights (thicknesses) of the first medium structure 121 and the second medium structure 122 should be a=54 µm, according to the above formula $$a = \frac{L \times \tan\theta_1 \times \tan\theta_2}{\tan\theta_1 + \tan\theta_2},$$

where L is the pixel width, i.e., the width of the first cross section. When the pixel resolution is about 160 PPI, the pixel width should be about 159 µm, and when the first included angle $\theta_1=40°$ and the second included angle $\theta_2=70°$, the heights (thicknesses) of the first medium structure 121 and the second medium structure 122 should be a=102 µm, according to the above formula $$a = \frac{L \times \tan\theta_1 \times \tan\theta_2}{\tan\theta_1 + \tan\theta_2},$$

where L is the pixel width, i.e., the width of the first cross section.

In the embodiment of the present disclosure, quantifiable data, for example, the desired heights (thicknesses) of the first medium structure 121 and the second medium structure 122 at different pixel resolutions, for realizing total reflection under a boundary condition (the light is incident along the diagonal line of the first cross section of the first medium structure 121) may be obtained according to the relationship between the refractive index of the first medium structure 121 and the refractive index of the second medium structure 122.

In some implementations, a material of the first medium structure 121 is a siloxane material. In some implementations, in order to increase the refractive index of the first medium structure 121, the material of the first medium structure 121 is the siloxane material doped with a filler, a doping ratio of the filler being about 50%, and a material of the filler includes titanium dioxide ($TiO_2$) and/or zirconium dioxide ($ZrO_2$). The refractive index of the first medium structure 121 may be increased by 0.3 to 0.4 by doping the filler made of titanium dioxide ($TiO_2$) therein, and the refractive index of the first medium structure 121 may be increased by 0.2 to 0.8 by doping the filler made of zirconium dioxide ($ZrO_2$) therein.

In some implementations, the first refractive index n1 ranges from about 1.6 to about 2.1.

In some implementations, a material of the second medium structure 122 is mainly composed of siloxane material. In order to reduce the refractive index of the second medium structure 122, the material of the second medium structure 122 is the siloxane material doped with hollow particles, and the hollow particles are generally silicon dioxide ($SiO_2$) spheres filled with air, nitrogen, or other gases therein, and each have a particle size ranging from about 10 nm to about 100 nm.

In some implementations, the second refractive index n2 ranges from about 1.3 to about 1.4.

Figure 6:
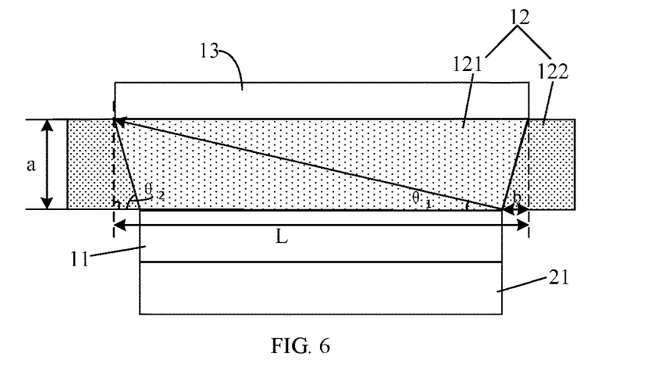
FIG. 6 is a schematic structural diagram of another sub-pixel unit according to an embodiment of the present disclosure.

FIG. 6 is a schematic structural diagram of another sub-pixel unit provided in an embodiment of the present disclosure, and as shown in FIG. 6, in some implementations, the sub-pixel unit further includes a light conversion unit 13, the light conversion unit 13 is located on a side of the first medium structure 121 away from the light emitting unit 11, and the light conversion unit 13 is disposed corresponding to the first medium structure 121.

As shown in FIG. 6, an orthographic projection of the light conversion unit 13 on the base layer 21 at least partially overlaps with an orthographic projection of the light emitting unit 11, corresponding to the light conversion unit 13, on the base layer 21, and the orthographic projection of the light conversion unit 13 on the base layer 21 at least partially overlaps with an orthographic projection of the first medium structure 121, corresponding to the light conversion unit 13, on the base layer 21.

In some implementations, the orthographic projection of the light conversion unit 13 on the base layer 21 covers the orthographic projection of light emitting unit 11, corresponding to the light conversion unit 13, on the base layer 21, and the orthographic projection of the light conversion unit 13 on the base layer 21 covers the orthographic projection of the first medium structure 121, corresponding to the light conversion unit 13, on the base layer 21. Therefore, an area that the light conversion unit 13 receives the light from the light emitting unit 11 corresponding thereto can be increased, and the light emitting efficiency of the display substrate can be improved.

The light conversion unit 13 is configured to convert color of light emitted by the light emitting unit 11 into a target color.

In some implementations, the light conversion unit 13 includes a quantum dot structure including quantum dot (QD) particles.

In some implementations, the light emitting unit 11 is a blue OLED device, and the light emitting unit 11 uses a blue fluorescent material or a phosphorescent material as a light source material for exciting the QD particles.

In some implementations, the light conversion unit 13 includes a red light conversion unit including a red quantum dot structure or a green light conversion unit including a green quantum dot structure, the red quantum dot structure is used for converting blue light emitted from the blue OLED device into red light, and the green quantum dot structure is used for converting blue light emitted from the blue OLED device into green light.

The light conversion unit 13 is formed by mixing QD nano particles with different sizes and scattering particles in resin, a doping ratio of the scattering particles is less than or equal to about 60%, generally, the QD nano particles in the red light conversion unit each have a QD particle size in a range from about 3 nm to about 7 nm, and the QD nano particles in the green light conversion unit each have a QD particle size in a range from about 4 nm to about 6 nm. A material of the QD nano particles may be one or more of $ZnCdSe_2$, CdSe, CdTe, InP, InAs, but not limited thereto, and may be selected from compounds of group II-VI elements, compounds of group III-V elements, compounds of group IV-VI elements, group IV elements, compounds of group IV elements, and/or combinations thereof.

In some implementations, the orthographic projection of the first medium structure 121 on a plane where the light emitting surface of the light emitting unit 11 is located covers the orthographic projection of the light emitting unit 11 on the plane where the light emitting surface of the light emitting unit 11 is located.

Figure 7:
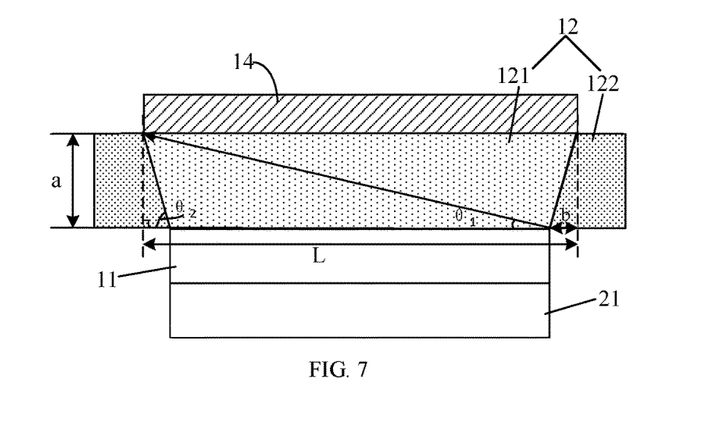
FIG. 7 is a schematic structural diagram of another sub-pixel unit according to an embodiment of the present disclosure.

FIG. 7 is a schematic structural diagram of another sub-pixel unit provided in an embodiment of the present disclosure, as shown in FIG. 7, in some implementations, the sub-pixel unit further includes a light-transmitting unit 14, the light-transmitting unit 14 is located on a side of the first medium structure 121 away from the light emitting unit 11, and the light-transmitting unit 14 is disposed corresponding to the first medium structure 121.

As shown in FIG. 7, an orthogonal projection of the light-transmitting unit 14 on the base layer 21 at least partially overlaps the orthogonal projection of the light emitting unit 11, corresponding to the light-transmitting unit 14, on the base layer 21, and the orthogonal projection of the light-transmitting unit 14 on the base layer 21 at least partially overlaps the orthogonal projection of the first medium structure 121, corresponding to the light-transmitting unit 14, on the base layer 21.

In some implementations, the orthographic projection of the light-transmitting unit 14 on the base layer 21 covers the orthographic projection of the light emitting unit 11, corresponding to the light-transmitting unit 14, on the base layer 21, and the orthographic projection of the light-transmitting unit 14 on the base layer 21 covers the orthographic projection of the first medium structure 121, corresponding to the light-transmitting unit 14, on the base layer 21.

The light-transmitting unit 14 is configured to transmit the light emitted by the light emitting unit 11 without changing the color of the light emitted by the light emitting unit 11. For example, if the color of the light emitted by the light emitting unit 11 is blue, the light transmitting through the light-transmitting unit 14 is blue.

In some implementations, a material of the light-transmitting unit 14 is a material with a relatively high refractive index, a large amount of scattering particles (with a doping ratio ≤ 60%) are distributed in the light-transmitting unit 14, or blue dyes are uniformly dispersed in the light-transmitting unit 14.

In some implementations, a cross section of the light emitting unit 11 parallel to the plane where the light emitting surface of the light emitting unit 11 is located may be in a shape of rectangle. In some implementations, the cross section of the first medium structure 121 parallel to the plane where the light emitting surface of the light emitting unit 11 is located may be in the shape of rectangle. In some implementations, a cross section of the light conversion unit 13 parallel to the plane where the light emitting surface of the light emitting unit 11 is located may be in the shape of rectangle. In some implementations, a cross section of the light-transmitting unit 14 parallel to the plane where the light emitting surface of the light emitting unit 11 is located may be in the shape of rectangle.

In some implementations, the height (thickness) a of the first medium structure 121 is the same as the height (thickness) of the second medium structure 122, and the bottom surface of the first medium structure 121 facing the light emitting unit 11 is flush with a bottom surface of the second medium structure 122 facing the light emitting unit 11, and the top surface of the first medium structure 121 facing away from the light emitting unit 11 is flush with a top surface of the second medium structure 122 facing away from the light emitting unit 11.

Figure 8:
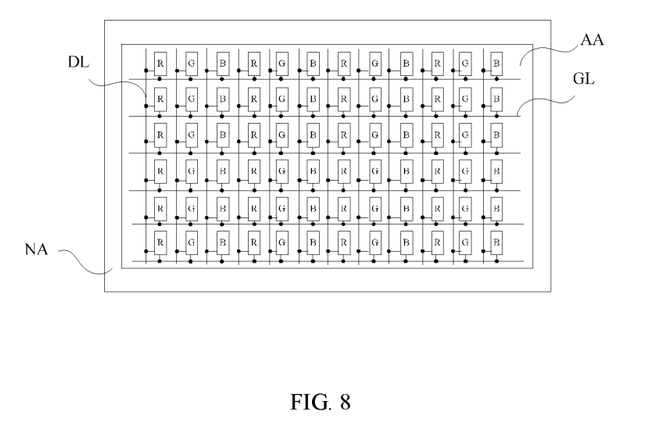
FIG. 8 is a schematic plan view of a display substrate according to an embodiment of the present disclosure.

FIG. 8 is a schematic plan view of a display substrate according to an embodiment of the present disclosure, and as shown in FIG. 8, the display substrate has a display area AA and an non-display area NA located outside the display area AA. A plurality of scanning lines GL and a plurality of data lines DL are arranged in the display area AA: the plurality of scanning lines GL intersect with the plurality of data lines DL to define a plurality of sub-pixel units. Illustratively, every three adjacent sub-pixel units in a row direction constitute one pixel unit, and the three adjacent sub-pixel units (e.g., a red sub-pixel unit R, a green sub-pixel unit G, and a blue sub-pixel unit B) are used to display different colors. The sub-pixel units in a same row are provided with a scanning signal by a same scanning line GL, and the sub-pixel units in a same column are provided with a data voltage signal by a same data line DL. The non-display area NA may be provided therein with a gate driving circuit and a driving chip (not shown), the scanning lines GL being connected to the gate driving circuit, and the data lines DL being connected to the driving chip.

Each sub-pixel unit includes a light emitting unit and a pixel circuit corresponding to the light emitting unit, the pixel circuit is connected to the scanning line GL and the data line DL, and the pixel circuit is configured to supply a driving signal to the light emitting unit according to electrical signals supplied from the scanning line GL and the data line DL to drive the light emitting unit to emit light. For example, the pixel circuit at least includes a writing transistor and a driving transistor, a gate of the writing transistor is connected to the scanning line GL, and the writing transistor is configured to transmit a data voltage signal provided by the data line DL to a gate of the driving transistor under control of the scanning signal provided by the scanning line GL, and the driving transistor supplies a driving current to the light emitting unit according to a voltage difference between the gate and a first electrode of the driving transistor, so that the light emitting unit emits light to perform display. It should be noted that the writing transistor and the driving transistor may be thin film transistors, each of which includes a gate, a first electrode and a second electrode, where one of the first electrode and the second electrode is a source and the other of the first electrode and the second electrode is a drain.

Figure 9:
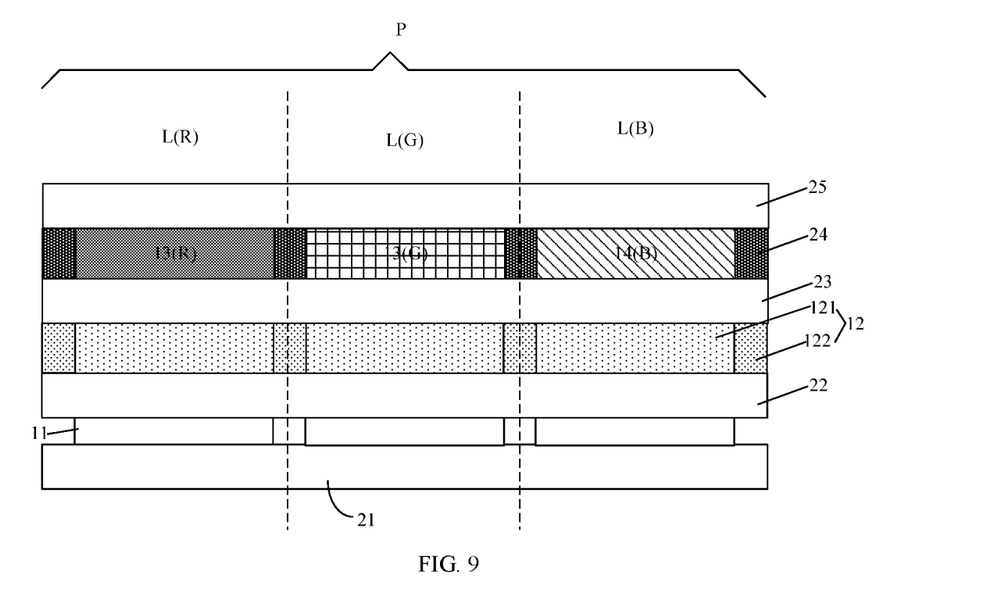
FIG. 9 is a schematic structural diagram of a display substrate according to an embodiment of the present disclosure.

FIG. 9 is a schematic structural diagram of a display substrate according to an embodiment of the present disclosure, and as shown in FIG. 9, the display substrate includes a base layer 21 and a plurality of sub-pixel units arranged in an array on a side of the base layer 21, at least a part of the plurality of sub-pixel units form one pixel unit P, and each pixel unit P includes a plurality of sub-pixel units L.

Illustratively, each pixel unit P includes three sub-pixel units L including a first sub-pixel unit L (R), a second sub-pixel unit L (G), and a third sub-pixel unit L (B). Illustratively, the first sub-pixel unit L (R) is a red sub-pixel unit, the second sub-pixel unit L (G) is a green sub-pixel unit, and the third sub-pixel unit L (B) is a blue sub-pixel unit.

In the embodiment of the present disclosure, each sub-pixel unit adopts the sub-pixel unit provided in the above embodiment.

In each pixel unit P, the colors of light emitted by the plurality of sub-pixel units L are different, and the colors of light emitted by the light emitting units 11 corresponding to the plurality of sub-pixel units L are all blue. Illustratively, in each pixel unit P, the plurality of sub-pixel units L include the first sub-pixel unit L (R), the second sub-pixel unit L (G), and the third sub-pixel unit L (B). The first sub-pixel unit L (R) is used for emitting red light, the second sub-pixel unit L (G) is used for emitting green light, and the third sub-pixel unit L (B) is used for emitting blue light.

In the display substrate, the light emitting units 11 in each sub-pixel unit L emit light of a same color, and the light emitting units 11 in each sub-pixel unit L emit light of a first color, illustratively, emit light of blue.

As shown in FIG. 9, the first sub-pixel unit L (R) includes a first light conversion unit 13 (R), the second sub-pixel unit L (G) includes a second light conversion unit 13 (G), and the third sub-pixel unit L (B) includes a light-transmitting unit 14 (B).

The first light conversion unit 13 (R) is configured to convert the first color of light emitted by light emitting unit 11 corresponding to the first light conversion unit 13 (R) into a second color, for example, the second color is red. The second light conversion unit 13 (G) is configured to convert the first color of the light emitted by the light emitting unit 11 corresponding to the second light conversion unit 13 (G) into a third color, for example, the third color is green. The light-transmitting unit 14 (B) is configured to transmit the light emitted by the light emitting unit 11 corresponding to the light-transmitting unit 14 (B) without changing the first color of the light.

In the embodiment of the present disclosure, the pixel circuit of the sub-pixel unit may be disposed on the base layer 21, and the pixel circuit is configured to drive the light emitting unit of each sub-pixel unit L on the base layer 21 to emit light.

Figure 10:
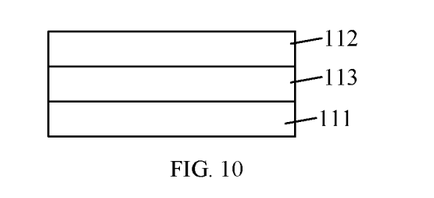
FIG. 10 is a schematic structural diagram of a light emitting unit of a sub-pixel unit according to an embodiment of the present disclosure.

In the embodiment of the present disclosure, the light emitting unit 11 of each sub-pixel unit L is disposed on the base layer 21. FIG. 10 is a schematic structural diagram of the light emitting unit of the sub-pixel unit in an embodiment of the present disclosure, and as shown in FIG. 10, in each sub-pixel unit L, the light emitting unit 11 may include: a first electrode 111, a second electrode 112 and a light emitting functional layer 113, where the first electrode 111 and the second electrode 112 are oppositely arranged, and the light emitting functional layer 113 is located between the second electrode 112 and the first electrode 111. The first electrode 111 may be an anode of the light emitting unit 11, the second electrode 112 may be a cathode of the light emitting unit 11, and the light emitting functional layer 113 emits light when a current is generated between the first electrode 111 and the second electrode 112. The light emitting function layer 113 may include a hole injection layer, a hole transport layer, an organic light emitting layer, an electron transport layer, and an electron injection layer which are sequentially stacked. In the embodiment of the present disclosure, the light emitting unit 11 may be an organic light emitting diode (OLED) device, in such case, the organic light emitting layer is made of an organic light emitting material, and the OLED is exemplarily a blue OLED.

In the embodiment of the present disclosure, as shown in FIG. 9, the display substrate further includes a thin film encapsulation (TFE) layer 22, the thin film encapsulation (TFE) layer 22 is located on a side of the light emitting units 11 away from the base layer 21, the thin film encapsulation (TFE) layer 22 is used for protecting the light emitting units 11 from water and oxygen, the thin film encapsulation (TFE) layer 22 is formed by sequentially stacking a first inorganic material layer, an organic material layer and a second inorganic material layer, the first inorganic material layer may be made of silicon oxide, the organic material layer may be formed by inkjet printing (IJP), and the second inorganic material layer may be made of silicon nitride.

In the embodiment of the present disclosure, as shown in FIG. 9, the light propagation unit 12 of each sub-pixel unit L is disposed on a side of the thin film encapsulation (TFE) layer 22 away from the base layer 21, the light propagation unit 12 includes the first medium structure 121 and the second medium structure 122, in the embodiment of the present disclosure, the second medium structure 122 is filled between the first medium structures 121 of any two adjacent sub-pixel units L, and colors of light emitted by the sub-pixel units corresponding to any two adjacent first medium structures 121 are different. For a detailed description of the first medium structure 121 in the light propagation unit 12, reference may be made to the related description of the sub-pixel unit in the above embodiment, and details are not repeated here.

In the embodiment of the present disclosure, as shown in FIG. 9, the display substrate further includes a planarization layer 23, and the planarization layer 23 is disposed on a side of each light propagation unit 12 away from the base layer 21. The planarization layer 23 is provided in order to planarize the light propagation unit 12 and to facilitate to manufacture the light conversion unit 13 and the light-transmitting unit 14.

In the embodiment of the present disclosure, as shown in FIG. 9, the light conversion unit 13 of each sub-pixel unit L is disposed on a side of the planarization layer 23 away from the base layer 21, and the light-transmitting unit 14 of each sub-pixel unit L is disposed on a side of the planarization layer 23 away from the base layer 21, for example, each pixel unit P includes the first sub-pixel unit L (R), the second sub-pixel unit L (G), and the third sub-pixel unit L (B), the light conversion unit 13 of each sub-pixel unit L includes the first light conversion unit 13 (R) for the first sub-pixel unit L (R), the second light conversion unit 13 (G) for the second sub-pixel unit L (G), and the light-transmitting unit 14 of each sub-pixel unit L includes the light-transmitting unit 14 (B) for the third sub-pixel unit L (B).

For specific description of the light conversion unit 13 and the light-transmitting unit 14, reference may be made to the description related to the sub-pixel unit in the above embodiment, and details are not repeated here.

In the embodiment of the present disclosure, as shown in FIG. 9, an isolation structure 24 is further disposed between any two adjacent light conversion units 13, an isolation structure 24 is further disposed between the light conversion unit 13 and the light-transmitting unit 14 which are adjacent to each other, the isolation structure 24 is a black matrix (BM), and the isolation structure is made of a silicon-based organic resin, and is doped with substances such as carbon black, so as to avoid crosstalk caused by different colors of light emitted by any two adjacent sub-pixel units L, and simultaneously to play a role of limiting positions of the two adjacent light conversion units 13, the light conversion unit 13 and the light-transmitting unit 14 adjacent to the light conversion unit 13.

In the embodiment of the present disclosure, as shown in FIG. 9, an encapsulation structure layer 25 is further disposed on a side of each of the light conversion unit 13, the light-transmitting unit 14 and the isolation structure 24 away from the base layer 21, and the encapsulation structure layer 25 is made of a mixture of an organic encapsulation material and an inorganic particle scattering material.

An embodiment of the disclosure further provides a display device, which includes the display substrate provided by the above embodiment.

The display device may be any product or component with a display function, such as a mobile phone, a tablet computer, a television, a display; a notebook computer, a digital photo frame, a navigator and the like.

Figure 11:
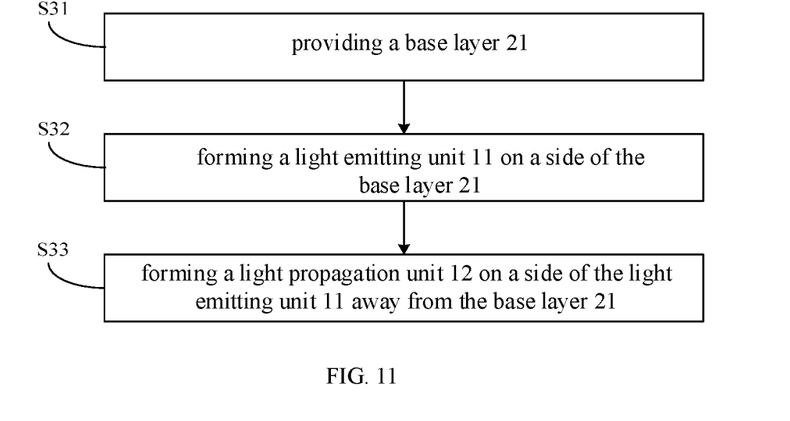
FIG. 11 is a flowchart of a method for manufacturing a sub-pixel unit according to an embodiment of the present disclosure.

An embodiment of the present disclosure further provides a method for manufacturing a sub-pixel unit, and FIG. 11 is a flowchart of the method for manufacturing the sub-pixel unit provided by the embodiment of the present disclosure, as shown in FIG. 1a, FIG. 2, and FIG. 11, the method for manufacturing the sub-pixel unit includes steps S31 to S33.

At step S31, providing a base layer 21.

At step S32, forming a light emitting unit 11 on a side of the base layer 21.

At step S33, forming a light propagation unit 12 on a side of the light emitting unit 11 away from the base layer 21.

The light propagation unit 12 includes a first medium structure 121 and a second medium structure 122, an orthogonal projection of the first medium structure 121 on the base layer 21 at least partially overlaps an orthogonal projection of the light emitting unit 11 on the base layer 21, and the second medium structure 122 is disposed in contact with at least one side of the first medium structure 121 in a direction parallel to a plane where the base layer 21 is located. The first medium structure 121 has a first refractive index, the second medium structure 122 has a second refractive index, and the first refractive index is greater than the second refractive index. A first included angle between a diagonal line and a bottom side of a first cross section of the first medium structure 121 is equal to a total reflection angle at a contact surface between the first medium structure 121 and the second medium structure 122, and the first cross section is a longitudinal cross section of the first medium structure 121 along a direction perpendicular to the contact surface and a direction perpendicular to a light emitting surface of the light emitting unit 11 (i.e., an AA' direction or a BB' direction), the first included angle is smaller than or equal to a preset angle, so that, in the light incident from a bottom surface of the first medium structure 121 facing the light emitting unit 11 at any angle, a proportion, greater than or equal to a preset proportion, of light is emitted from a top surface of the first medium structure 121 facing away from the light emitting unit 11, where the preset angle is about 60°.

An embodiment of the present disclosure further provides a method for manufacturing a display substrate, where the method includes: providing a base layer: forming a plurality of light emitting units arranged in an array on a side of the base layer, where the light emitting units correspond to sub-pixel units one by one, and at least part of the plurality of sub-pixel units form one pixel unit: and forming a light propagation unit on a side of each light emitting unit away from the base layer.

The light propagation unit includes a first medium structure and a second medium structure, an orthographic projection of the first medium structure on the base layer is at least partially overlapped with an orthographic projection of one of the light emitting units, corresponding to the first medium structure, on the base layer, and the second medium structure is arranged in contact with at least one side of the first medium structure in a direction parallel to a plane where the base layer is located. The first medium structure has a first refractive index, the second medium structure has a second refractive index, and the first refractive index is larger than the second refractive index. A first included angle between a diagonal line and a bottom edge of a first cross section of the first medium structure is equal to a total reflection angle at a contact surface between the first medium structure and the second medium structure, and the first cross section is a cross section of the first medium structure along a direction perpendicular to the contact surface and a direction perpendicular to a light emitting surface of the light emitting unit. The first included angle is smaller than or equal to a preset angle, so that, in the light incident from the bottom surface of the first medium structure facing the light emitting unit at any angle, a proportion, larger than or equal to a preset proportion, of light is emitted from a top surface of the first medium structure facing away from the light emitting unit, where the preset angle is about 60°.

Figure 12:
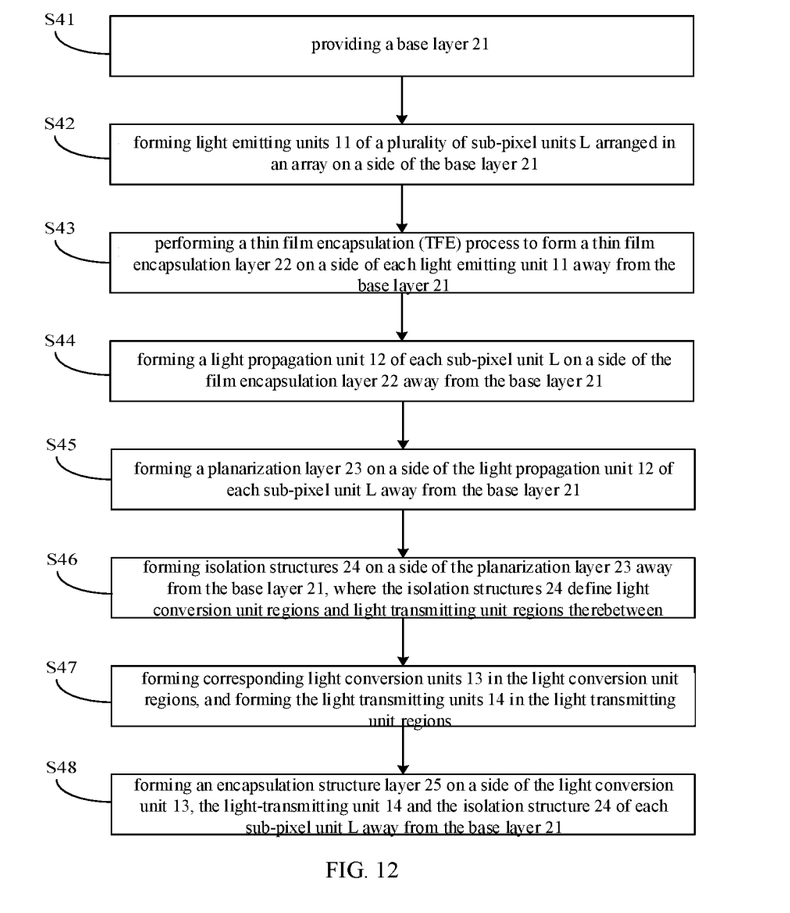
FIG. 12 is a flowchart of a method for manufacturing a display substrate according to an embodiment of the present disclosure.

An embodiment of the present disclosure further provides another method for manufacturing a display substrate, and FIG. 12 is a flowchart of the method for manufacturing the display substrate provided in the embodiment of the present disclosure, and as shown in FIGS. 9 and 12, the method includes steps S41 to S48.

At step S41, providing a base layer 21.

At step S42, forming light emitting units 11 of a plurality of sub-pixel units L arranged in an array on a side of the base layer 21.

The light emitting units correspond to the sub-pixel units one by one, and at least part of the sub-pixel units form one pixel unit.

At step S43, performing a thin film encapsulation (TFE) process to form a thin film encapsulation layer 22 on a side of each light emitting unit 11 away from the base layer 21.

At step S44, forming a light propagation unit 12 of each sub-pixel unit L on a side of the thin film encapsulation layer 22 away from the base layer 21.

Specifically, a second medium structure material layer is formed on the side of the thin film encapsulation layer 22 away from the base layer 21, and a patterning process is performed on the second medium structure material layer by using a photolithography technique to form second medium structures 122 and first medium structure regions, between the second medium structures 122, corresponding to regions of the light emitting units 11: a first medium structure material is filled in the first medium structure regions and cured by using ultraviolet (UV) exposure or thermal curing to form first medium structures 121.

At step S45, forming a planarization layer 23 on a side of the light propagation unit 12 of each sub-pixel unit L away from the base layer 21.

At step S46, forming isolation structures 24 on a side of the planarization layer 23 away from the base layer 21, where the isolation structures 24 define light conversion unit regions and light transmitting unit regions therebetween.

Specifically, an isolation structure material layer is formed on the side of the planarization layer 23 away from the base layer 21, and a patterning process is performed on the isolation structure material layer by using a photolithography technique to form the isolation structures 24, and the light conversion unit regions and the light-transmitting unit regions, which are disposed corresponding to light propagation units 12 one by one.

At step S47, forming respective light conversion units 13 in the light conversion unit regions, and forming respective light-transmitting units 14 in the light-transmitting unit regions.

Specifically, a quantum dot structure material, such as a quantum dot (QD) particle colloid, with a corresponding color, is filled in each light conversion unit region by using an inkjet printing technique, and is cured and stabilized to form the light conversion unit 13 of each sub-pixel unit L, such as a first light conversion unit 13 (R) for the first sub-pixel unit L (R) and a second light conversion unit 13 (G) for the second sub-pixel unit L (G): a material for the light-transmitting unit is filled in each light-transmitting unit region, and is cured to form the light-transmitting unit 14 of each sub-pixel unit L, such as a light-transmitting unit 14 (B) for the third sub-pixel unit L (B).

At step S48, forming an encapsulation structure layer 25 on a side of the light conversion unit 13, the light-transmitting unit 14 and the isolation structure 24 of each sub-pixel unit L away from the base layer 21.

Specifically, an encapsulation is performed by using a mixed solution of an organic encapsulation material and an inorganic particle scattering material to form the encapsulation structure layer 25.

It will be understood that the above embodiments are merely exemplary embodiments employed to illustrate the principles of the present disclosure, and the present disclosure is not limited thereto. It will be apparent to those skilled in the art that various changes and modifications may be made therein without departing from the spirit and scope of the present disclosure, and these changes and modifications are to be considered within the scope of the present disclosure.

What is claimed is:

1. A display substrate, comprising a base layer and a plurality of sub-pixel units which are arranged in an array on a side of the base layer, the sub-pixel units corresponding to light emitting units one by one, and at least part of the sub-pixel units form one pixel unit, wherein the sub-pixel unit further comprises a light propagation unit located on a side of a light emitting surface of the light emitting unit; the light propagation unit comprises a first medium structure and a second medium structure, an orthographic projection of the first medium structure on the base layer at least partially overlaps with an orthographic projection of one of the light emitting units, corresponding to the first medium structure, on the base layer, and the second medium structure is arranged in contact with at least one side of the first medium structure in a direction parallel to a plane where the base layer is located; the first medium structure has a first refractive index, the second medium structure has a second refractive index, and the first refractive index is greater than the second refractive index;

a first included angle between a diagonal line and a bottom side of a first cross section of the first medium structure is equal to a total reflection angle at a contact surface between the first medium structure and the second medium structure, and the first cross section is a cross section of the first medium structure along a direction perpendicular to the contact surface and a direction perpendicular to the light emitting surface of the light emitting unit;

the first included angle is smaller than or equal to a preset angle, so that, in the light incident from a bottom surface of the first medium structure facing the light emitting unit at any angle, a proportion, larger than or equal to a preset proportion, of light is emitted from a top surface of the first medium structure facing away from the light emitting unit, wherein the preset angle is about 60°.

2. The display substrate of claim 1, wherein the first included angle is in a range from about 10° to about 40°.

3. The display substrate of claim 1, wherein a height and a width of the first cross section of the first medium structure satisfy a following relationship:

$$a = \frac{L \times \tan \theta_1 \times \tan \theta_2}{\tan \theta_1 + \tan \theta_2},$$

wherein a is the height of the first cross section of the first medium structure, L is the width of the first cross section of the first medium structure, $\theta_1$ is the first included angle, and $\theta_2$ is a second included angle between the contact surface between the second medium structure and the first medium structure and a bottom surface of the second medium structure facing the light emitting unit.

4. The display substrate of claim 3, wherein the second included angle is in a range from about 10° to about 90°.

5. The display substrate of claim 4, wherein the second included angle is in a range from about 50° to about 90°.

6. The display substrate of claim 3, wherein the height of the first cross section ranges from about 2 μm to about 20 μm.

7. The display substrate of claim 1, wherein the sub-pixel unit further comprises a light conversion unit located at a side of the first medium structure away from the light emitting unit;

an orthographic projection of the light conversion unit on the base layer is at least partially overlapped with an orthographic projection of the light emitting unit on the base layer;

the orthographic projection of the light conversion unit on the base layer at least partially overlaps with the orthographic projection of the first medium structure on the base layer;

the light conversion unit is configured to convert a color of light emitted by the light emitting unit into a target color.

8. The display substrate of claim 7, wherein the light conversion unit comprises a quantum dot structure.

9. The display substrate of claim 7, wherein the orthographic projection of the light conversion unit on the base layer covers the orthographic projection of the light emitting unit, corresponding to the light conversion unit, on the base layer.

10. The display substrate of claim 1, wherein a ratio of the second refractive index to the first refractive index is in a range from about 0.5 to about 0.9.

11. The display substrate of claim 1, wherein an orthographic projection of the first medium structure on a plane where the light emitting surface of the light emitting unit is located covers an orthographic projection of the light emitting unit on the plane where the light emitting surface of the light emitting unit is located.

12. The display substrate of claim 1, wherein the first cross section of the first medium structure is in a shape of rectangle, and a cross section of the second medium structure in a direction perpendicular to the contact surface and a direction perpendicular to the light emitting surface of the light emitting unit is in a shape of rectangle; or the first cross section of the first medium structure is in a shape of inverted trapezoid, and the cross section of the second medium structure in the direction perpendicular to the contact surface and the direction perpendicular to the light emitting surface of the light emitting unit is in a shape of trapezoid.

13. The display substrate of claim 1, wherein the second medium structure is disposed between any two adjacent first medium structures, and colors of light emitted from the sub-pixel units corresponding to any two adjacent first medium structures are different.

14. The display substrate of claim 1, wherein a material of the second medium structure is a siloxane material doped with hollow particles.

15. The display substrate of claim 1, wherein the plurality of sub-pixel units comprise a red sub-pixel unit, a green sub-pixel unit and a blue sub-pixel unit, and the light emitting units corresponding to the plurality of sub-pixel units emit blue light.

16. The display substrate of claim 1, wherein each pixel unit comprises three sub-pixel units comprising a first sub-pixel unit, a second sub-pixel unit, and a third sub-pixel unit;
- colors of light emitted by the light emitting units corresponding to the sub-pixel units are all a first color;
- the first sub-pixel unit comprises a first light conversion unit, the second sub-pixel unit comprises a second light conversion unit, and the third sub-pixel unit comprises a light-transmitting unit;
- the first light conversion unit is configured to convert the first color of light emitted by the light emitting unit corresponding thereto into a second color;
- the second light conversion unit is configured to convert the first color of light emitted by the light emitting unit corresponding thereto into a third color;
- the light-transmitting unit is configured to transmit the light emitted by the light emitting unit corresponding thereto without changing the first color of the light.

17. The display substrate of claim 16, wherein the first color is blue, the second color is red, and the third color is green.

18. A display device, comprising the display substrate of claim 1.

19. The display substrate of claim 1, wherein a thickness of the first medium structure is the same as a thickness of the second medium structure.

20. The display substrate of claim 1, wherein a bottom surface of the first medium structure facing the light emitting unit is flush with a bottom surface of the second medium structure facing the light emitting unit, and a top surface of the first medium structure facing away from the light emitting unit is flush with a top surface of the second medium structure facing away from the light emitting unit.

* * * * *